(12) United States Patent
Noguchi

(10) Patent No.: US 11,746,398 B2
(45) Date of Patent: *Sep. 5, 2023

(54) METAL COMPOSITION, INTERMETALLIC COMPOUND MEMBER AND JOINED BODY

(71) Applicant: Murata Manufacturing Co., Ltd., Nagaokakyo (JP)

(72) Inventor: Masumi Noguchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/015,316

(22) Filed: Jun. 22, 2018

(65) Prior Publication Data

US 2018/0298468 A1    Oct. 18, 2018

Related U.S. Application Data

(63) Continuation of application No. PCT/JP2016/084699, filed on Nov. 24, 2016.

(30) Foreign Application Priority Data

Jan. 7, 2016  (JP) .................. 2016-001486

(51) Int. Cl.
  *B23K 20/02*   (2006.01)
  *C22C 9/06*    (2006.01)
  (Continued)

(52) U.S. Cl.
  CPC .............. *C22C 9/06* (2013.01); *B23K 20/026* (2013.01); *B23K 35/025* (2013.01); *B23K 35/0238* (2013.01); *B23K 35/22* (2013.01); *B23K 35/262* (2013.01); *B23K 35/302* (2013.01); *B23K 35/304* (2013.01); *B23K 35/3033* (2013.01);
  (Continued)

(58) Field of Classification Search
  None
  See application file for complete search history.

(56) References Cited

U.S. PATENT DOCUMENTS 3,197,859 A * 8/1965  Cape ................ B23K 35/302
                                                 228/249
5,188,799 A * 2/1993  Mori ................ B23K 35/302
                                                 148/414

(Continued)

FOREIGN PATENT DOCUMENTS

JP    H07190992 A    7/1995
JP    2001510205 A   7/2001
(Continued)

OTHER PUBLICATIONS

International Search Report issued for PCT/JP2016/084699, dated Feb. 21, 2017.
(Continued)

*Primary Examiner* — Humera N. Sheikh
*Assistant Examiner* — Kim S. Horger
(74) *Attorney, Agent, or Firm* — ArentFox Schiff LLP

(57) ABSTRACT

A metal composition that includes a first metal; and a second metal containing a first transition metal element added to a first alloy having a melting point higher than a melting point of the first metal, and the second metal is an alloy capable of producing an intermetallic compound with the first metal.

5 Claims, 13 Drawing Sheets

(51) Int. Cl.
  *B23K 35/22* (2006.01)
  *B23K 35/02* (2006.01)
  *B23K 35/30* (2006.01)
  *H05K 3/34* (2006.01)
  *B23K 35/26* (2006.01)
  *B23K 101/36* (2006.01)
  *H05K 1/18* (2006.01)

(52) U.S. Cl.
  CPC ......... *H05K 3/3457* (2013.01); *H05K 3/3463* (2013.01); *B23K 2101/36* (2018.08); *H05K 1/181* (2013.01); *H05K 3/3431* (2013.01); *H05K 2201/10015* (2013.01); *H05K 2203/0415* (2013.01)

(56) References Cited

U.S. PATENT DOCUMENTS

| | | | |
|---|---|---|---|
| 5,766,776 A * | 6/1998 | Buresch | B32B 15/01 |
| | | | 420/557 |
| 6,017,634 A | 1/2000 | Capote | |
| 8,388,724 B2 | 3/2013 | Kato et al. | |
| 9,005,521 B2 * | 4/2015 | Ookubo | C22C 9/06 |
| | | | 420/485 |
| 9,105,987 B2 | 8/2015 | Nakano et al. | |
| 2009/0220812 A1 | 9/2009 | Kato et al. | |
| 2012/0156512 A1 * | 6/2012 | Nakano | H01L 24/83 |
| | | | 428/457 |
| 2013/0270001 A1 | 10/2013 | Nakano et al. | |
| 2015/0034701 A1 * | 2/2015 | Takaoka | H01G 4/2325 |
| | | | 228/101 |

FOREIGN PATENT DOCUMENTS

| | | | | |
|---|---|---|---|---|
| JP | 2004174522 A * | 6/2004 | | H01L 24/743 |
| JP | 4369643 B2 | 11/2009 | | |
| JP | 2010274326 A | 12/2010 | | |
| JP | 2012076098 A | 4/2012 | | |
| JP | 2015042421 A | 3/2015 | | |
| WO | 9903597 A1 | 1/1999 | | |
| WO | 2007125861 A1 | 11/2007 | | |
| WO | 2010066795 A2 | 6/2010 | | |
| WO | WO-2012066795 A1 * | 5/2012 | | B22F 1/0014 |

OTHER PUBLICATIONS

Written Opinion of the International Searching Authority issued for PCT/JP2016/084699, dated Feb. 21, 2017.

* cited by examiner

FIG. 12

| X (AMOUNT OF Ni) | Y (AMOUNT OF Co) | AVERAGE GRAIN SIZE OF INTERMETALLIC COMPOUND (μm) |
|---|---|---|
| 1 | 0 | 10.2 |
| 3 | 0 | 9.6 |
| 5 | 0 | 8.6 |
| 10 | 0 | 10.5 |
| 5 | 0.5 | 2.9 |
| 5 | 1.5 | 2.4 |
| 1 | 3 | 2.6 |
| 3 | 3 | 1.7 |
| 5 | 3 | 1.6 |
| 10 | 5 | 2.2 |
| 5 | 5 | 2.7 |
| 5 | 10 | 2.9 |

| SAMPLE NO. | AMOUNT OF Ni | AMOUNT OF Co | AMOUNT OF Fe | Erosion Speed |
|---|---|---|---|---|
| 1 | 5 | | | 11.8 |
| 2 | 2 | 4 | | 82.0 |
| 3 | 4 | 2 | | 92.8 |
| 4 | 4 | 4 | | 94.7 |
| 5 | 5 | 3 | | 100.5 |
| 6 | 4 | | 4 | 40.6 |

METAL COMPOSITION, INTERMETALLIC COMPOUND MEMBER AND JOINED BODY

CROSS REFERENCE TO RELATED APPLICATIONS

The present application is a continuation of International application No. PCT/JP2016/084699, filed Nov. 24, 2016, which claims priority to Japanese Patent Application No. 2016-001486, filed Jan. 7, 2016, the entire contents of each of which are incorporated herein by reference.

FIELD OF THE INVENTION

The present invention relates to a metal composition containing a metal component, an intermetallic compound member produced from the metal composition, and a joined body including the intermetallic compound member.

BACKGROUND OF THE INVENTION

Conventionally, for example, a metal composition is used for joining a first joining object and a second joining object to each other. As such a metal composition, for example, Patent Document 1 discloses a conductive material.

The conductive material includes a metal component containing Sn powder and a CuNi alloy powder, and a flux. The conductive material is disposed between a pair of electrodes. Then, the Sn powder and the CuNi alloy powder in the conductive material react with each other under heating to produce a CuNiSn alloy which is an intermetallic compound. As a result, the conductive material becomes an intermetallic compound member composed of an intermetallic compound. Accordingly, the intermetallic compound member joins the pair of electrodes. The intermetallic compound member constitutes a joined body together with the pair of electrodes.

Here, the heating temperature is equal to or higher than the melting point of Sn and equal to or lower than a melting point of the CuNi alloy, and is, for example, 250 to 350° C. The CuNiSn alloy has a high melting point (for example, 400° C. or higher). Therefore, the intermetallic compound member is excellent in heat resistance.

Patent Document 1: WO 2012/066795 A

SUMMARY OF THE INVENTION

However, a conventional intermetallic compound member including the intermetallic compound member disclosed in Patent Document 1 is generally hard to cause crystal slip except for some special ones having a face-centered cubic lattice structure. For this reason, it is known that the conventional intermetallic compound member is hard to be plastically deformed. Therefore, when mechanical stress due to thermal shock is large, the intermetallic compound member disclosed in Patent Document 1 low in plastic deformability described above cannot absorb the mechanical stress, and brittle fracture may occur.

An object of the present invention is to provide a metal composition capable of producing an intermetallic compound member that has high plastic deformability at high temperature and that hardly causes brittle fracture, an intermetallic compound member, and a joined body.

A metal composition of the present invention contains a first metal and a second metal. The second metal is an alloy in which a first transition metal element is added to a first alloy having a melting point higher than a melting point of the first metal, and the second metal is an alloy capable of forming an intermetallic compound with the first metal.

Here, the first metal is, for example, Sn or an Sn-based alloy. The first alloy is, for example, a CuAl alloy, a CuCr alloy, a CuNi alloy or a CuMn alloy. The first transition metal element is, for example, any one of Co, Fe, and Cr. In the case where the second metal is a Cu-xNi-yCo alloy, it is preferred that x is in a range of 1 to 30, and y is in a range of 0.5 to 20.

In this configuration, the first metal and the second metal react with each other to produce an intermetallic compound. As a result, the metal composition with this constitution produces an intermetallic compound member composed of a polycrystalline intermetallic compound. An average crystal grain size of the intermetallic compound member produced with this constitution is smaller than an average crystal grain size of the conventional intermetallic compound member. The reason for this is presumed that the second metal is an alloy in which the first transition metal element is added to the first alloy.

Therefore, the intermetallic compound member with this constitution has high plastic deformability at high temperature as compared with the conventional intermetallic compound member having a large crystal grain size. Therefore, even if mechanical stress due to thermal shock is large, the intermetallic compound member with this constitution can absorb the mechanical stress and hardly causes brittle fracture.

Therefore, the metal composition with this constitution has high plastic deformability at high temperature and can produce an intermetallic compound member which is hard to cause brittle fracture. Further, the intermetallic compound member has high strength at room temperature.

The metal composition of the present invention preferably further contains a flux. The flux serves a reducing function of removing an oxide film on a surface of the first metal and a surface of the second metal. Therefore, the metal composition with this constitution can promote the reaction between the first metal and the second metal.

In addition, an intermetallic compound member of the present invention is composed of the intermetallic compound including the first metal and the second metal. The second metal is an alloy in which a first transition metal element is added to a first alloy having a melting point higher than a melting point of the first metal, and the second metal is an alloy which produces an intermetallic compound by reaction with the first metal. An average crystal grain size of the intermetallic compound is preferably 3 μm or less.

The intermetallic compound member of the present invention is produced from the metal composition of the present invention. Therefore, the intermetallic compound member of the present invention has high plastic deformability at high temperature and hardly causes brittle fracture. Further, the intermetallic compound member of the present invention has high strength at room temperature.

Further, a joined body of the present invention includes a first joining object, a second joining object, and the intermetallic compound member of the present invention for joining the first joining object and the second joining object to each other.

Since the joined body of the present invention includes the intermetallic compound member of the present invention, it has high plastic deformability at high temperature and hardly causes brittle fracture. Furthermore, the joined body of the present invention has high strength at room temperature.

In the joined body of the present invention, it is preferred that the intermetallic compound continuously exists from the first joining object to the second joining object in the intermetallic compound member.

The metal composition of the present invention can produce an intermetallic compound member that has high plastic deformability at high temperature and that hardly causes brittle fracture. Further, the intermetallic compound member and joined body of the present invention have high plastic deformability at high temperature and hardly cause brittle fracture.

BRIEF EXPLANATION OF THE DRAWINGS

FIG. 12 is a table showing a relationship between a crystal grain size of an intermetallic compound and a weight ratio of Ni and Co.

DETAILED DESCRIPTION OF THE INVENTION

Hereinafter, a metal composition 10, an intermetallic compound member 100 and a joined body 150 according to an embodiment of the present invention will be described.

Figure 1:
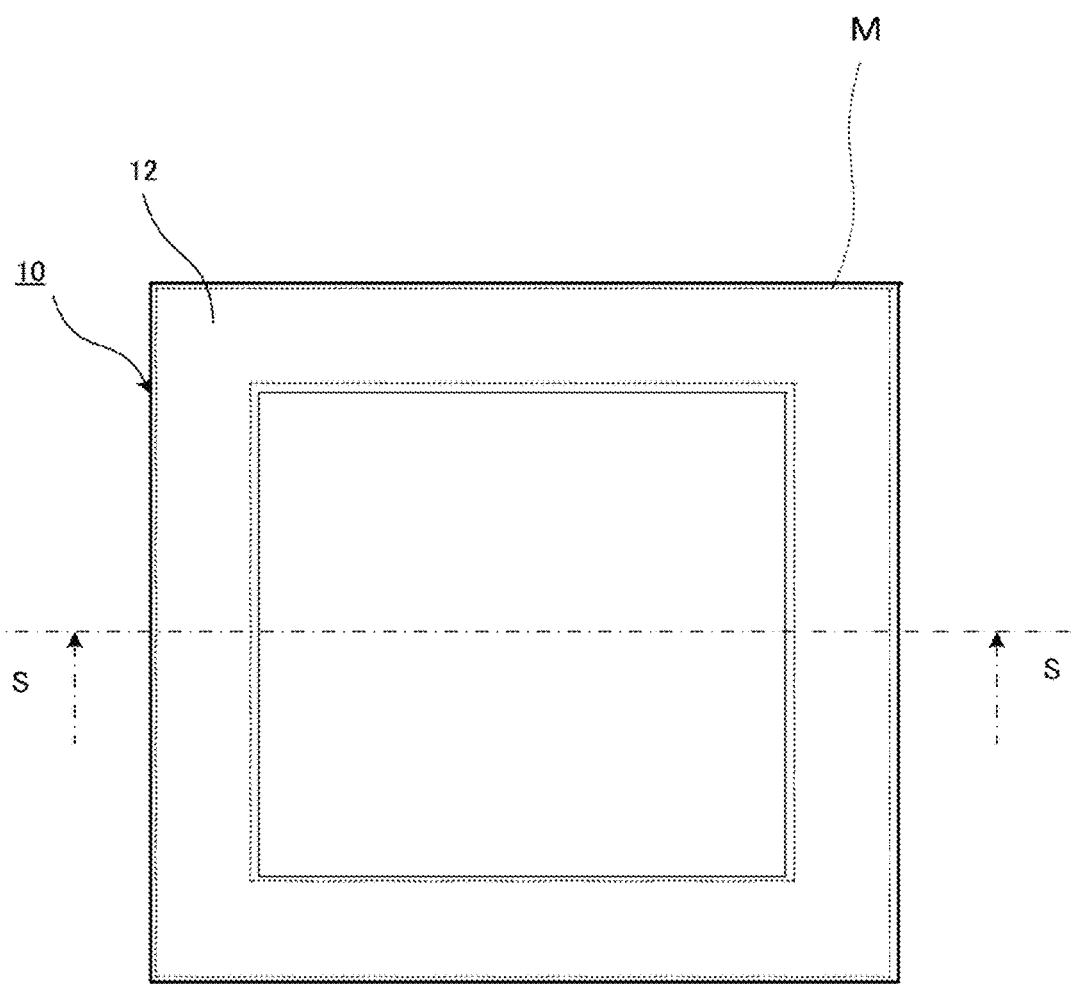
FIG. 1 is a front view of a metal composition 10 according to an embodiment of the present invention.
Figure 2:
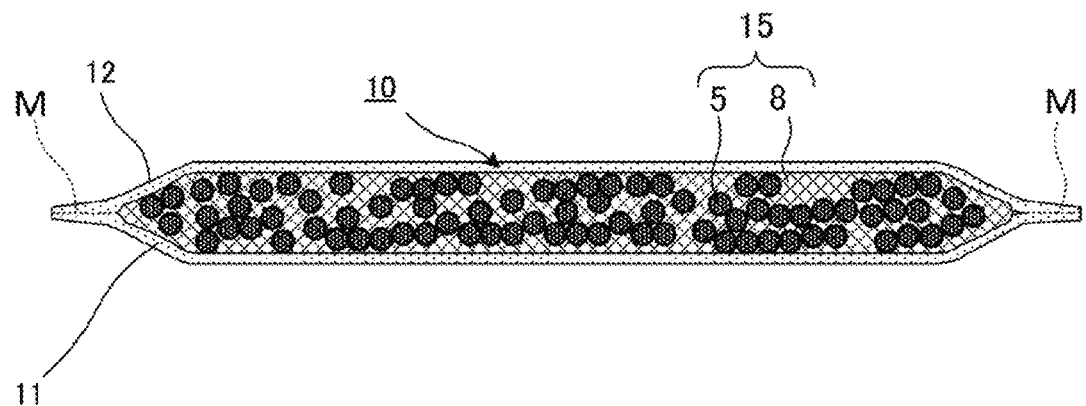
FIG. 2 is a cross-sectional view taken along the line S-S shown in FIG. 1.

FIG. 1 is a front view of the metal composition 10 according to the embodiment of the present invention. FIG. 2 is a cross-sectional view taken along the line S-S shown in FIG. 1. Note that a dotted line in FIG. 1 indicates a fused portion M in which a metal foil 11 and a metal foil 12 are fused with each other.

The metal composition 10 contains a metal foil 11 made of a first metal, a high melting point alloy paste 15 made of a second metal, and a metal foil 12 made of a first metal.

Here, the second metal is an alloy in which a first transition metal element is added to a first alloy, and is an alloy which produces an intermetallic compound by reaction with the first metal in the metal foils 11 and 12. The intermetallic compound is composed of at least one of the metal foil 11 and the metal foil 12 and the second metal.

A material of the metal foil 11 is Sn or an Sn-based alloy. A material of the metal foil 12 is Sn or an Sn-based alloy. Examples of the Sn-based alloy include SnAgCu alloy, SnAg alloy, SnCu alloy, SnBi alloy, SnSb alloy, SnAu alloy, SnPb alloy, SnZn alloy, and the like.

The material of the metal foil 11 and the material of the metal foil 12 may be different materials or may be the same material.

Examples of a material of the first alloy include CuNi alloy, CuMn alloy, CuAl alloy and CuCr alloy. In addition, the material of the first alloy may be, other than the above materials, CuTi alloy, CuCo alloy, CuPt alloy, NiCr alloy, NiV alloy, NiPd alloy, NiPt alloy, NiAu alloy, or the like.

A material of the first transition metal element is a metal element from scandium Sc having an atomic number 21 to copper Cu having an atomic number 29. The material of the first transition metal element is preferably any element of Co, Fe, and Cr.

In addition, a material of the second metal is a material in which the first transition metal element is added to the first alloy, and examples thereof include CuNiCo alloy, CuMnCo alloy, CuNiFe alloy, CuMnFe alloy, CuNiCr alloy, CuMnCr alloy, and the like. When the second metal is a Cu-xNi-yCo alloy, it is preferred that x is in the range of 1 to 30, and y is in the range of 0.5 to 20.

Examples of a material of the intermetallic compound include CuNiCoSn alloy and CuMnCoSn alloy. Specific examples of the material of the intermetallic compound include $((Cu, Ni, Co)_6Sn_5)$, $((Cu, Ni, Fe)_6Sn_5)$, $((Cu, Ni, Cr)_6Sn_5)$, and the like.

Therefore, a melting point of the first alloy is higher than melting points of the metal foil 11 and the metal foil 12. A melting point of the second metal is higher than melting points of the metal foil 11 and the metal foil 12. A melting point of the intermetallic compound is higher than melting points of the metal foil 11 and the metal foil 12.

As shown in FIG. 1, the metal foil 11 and the metal foil 12 are fusion-bonded around the entire circumference of the high melting point alloy paste 15 with the high melting point alloy paste 15 sandwiched therebetween. As a result, as shown in FIG. 2, the metal foil 11 and the metal foil 12 house the high melting point alloy paste 15. That is, the metal foil 11 and the metal foil 12 seal the high melting point alloy paste 15. In addition, the sealing corresponds to an example of the housing.

Accordingly, the high melting point alloy paste 15 is completely sealed. As shown in FIG. 2, the high melting point alloy paste 15 is a paste in which a plurality of high melting point alloy particles 5 (metal components) composed of the second metal are uniformly dispersed in an organic component 8. Therefore, the metal foil 11 and the metal foil 12 can prevent the plurality of high melting point alloy particles 5 from being oxidized.

An average particle size (D50) of the high melting point alloy particles 5 is preferably within the range of 0.1 µm to 30 µm. Here, the average particle size (D50) means, for example, a particle size at an accumulated value of 50% in a particle size distribution obtained by laser diffraction/scattering method.

When the average particle size of the high melting point alloy particles 5 is 0.1 µm or more, the surface area of the high melting point alloy particles 5 can be appropriately reduced. This makes it possible to suppress the formation of oxides on the surface of the high melting point alloy particles 5, to improve the wettability of the high melting point alloy particles 5 to molten Sn, and to promote the reaction for producing the intermetallic compound.

On the other hand, when the average particle size of the high melting point alloy particles 5 is 30 µm or less, a size of gaps between the high melting point alloy particles 5 is appropriately reduced. This makes it possible to exert the reaction for producing the intermetallic compound up to the central portion of the high melting point alloy particle 5, and to increase an amount of the intermetallic compound to be produced.

In addition, in the high melting point alloy paste 15 of the metal composition 10, it is preferred that a compounding ratio of the metal component and the organic component is in the range of 75:25 to 99.5:0.5 by weight ratio.

By setting the compounding ratio of the metal component and the organic component within the above range, it is possible to attain sufficient viscosity, and it is possible to suppress the possibility of the metal component exfoliating from the organic component. On the other hand, when the compounding amount of the metal component is smaller than the above amount, the high melting point alloy particles 5 cannot be adequately caused to react, and there is a possibility that a large amount of unreacted high melting point alloy particles 5 remain in the intermetallic compound member 100 described later.

Next, as shown in FIG. 2, the organic component 8 contains a flux, a solvent, a thixotropic agent, and the like.

The flux contains rosin and an activator. The flux serves a reducing function of removing an oxide film on a surface of each of the metal foil 11, the metal foil 12, and the high melting point alloy particle 5. Therefore, the flux can promote the reaction between the melted metal foil 11 and the second metal or between the metal foil 12 and the second metal, which will be described in detail later.

Examples of the rosin include rosin derivatives such as natural rosin, hydrogenated rosin, disproportionated rosin, polymerized rosin, unsaturated dibasic acid-modified rosin, acrylic acid-modified rosin and the like, and a mixture thereof. For example, polymerized rosin R-95 is used for the rosin.

Also, the activator promotes the reduction reaction of the flux. Examples of the activator include monocarboxylic acids (for example, formic acid, acetic acid, lauric acid, palmitic acid, stearic acid, and benzoic acid), dicarboxylic acids (for example, oxalic acid, malonic acid, succinic acid, glutaric acid, adipic acid, suberic acid, azelaic acid, sebacic acid, and phthalic acid), bromoalcohols (for example, 1-bromo-2-butanol), hydrohalogenic acid salts of organic amines, bromoalkanes, bromoalkenes, benzyl bromides, polyamines, and chlorine-based activators. For example, adipic acid is used for the activator.

The solvent adjusts the viscosity of the high melting point alloy paste 15 of the metal composition 10. Examples of the solvent include alcohol, ketone, ester, ether, aromatic solvent, hydrocarbons, and the like. For example, hexyl diglycol (HeDG) is used for the solvent.

The thixotropic agent maintains the metal component and the organic component not to be separated after uniformly mixing the metal component with the organic component. Examples of the thixotropic agent include hydrogenated castor oil, carnauba wax, amides, hydroxy fatty acids, dibenzylidene sorbitol, bis(p-methylbenzylidene) sorbitols, beeswax, stearic acid amide, ethylene-bis amide hydroxystearate, and the like.

The high melting point alloy paste 15 may contain adjuncts such as Ag, Au, Al, Bi, C, Co, Cu, Fe, Ga, Ge, In, Mn, Mo, Ni, P, Pb, Pd, Pt, Si, Sb, Zn, and the like. In addition, the high melting point alloy paste 15 may contain not only the adjuncts but also metal complexes, metal compounds, and the like as additives.

Hereinafter, a specific method for joining a first joining object 101 and a second joining object 102 to each other using the metal composition 10 will be described.

Figure 3:
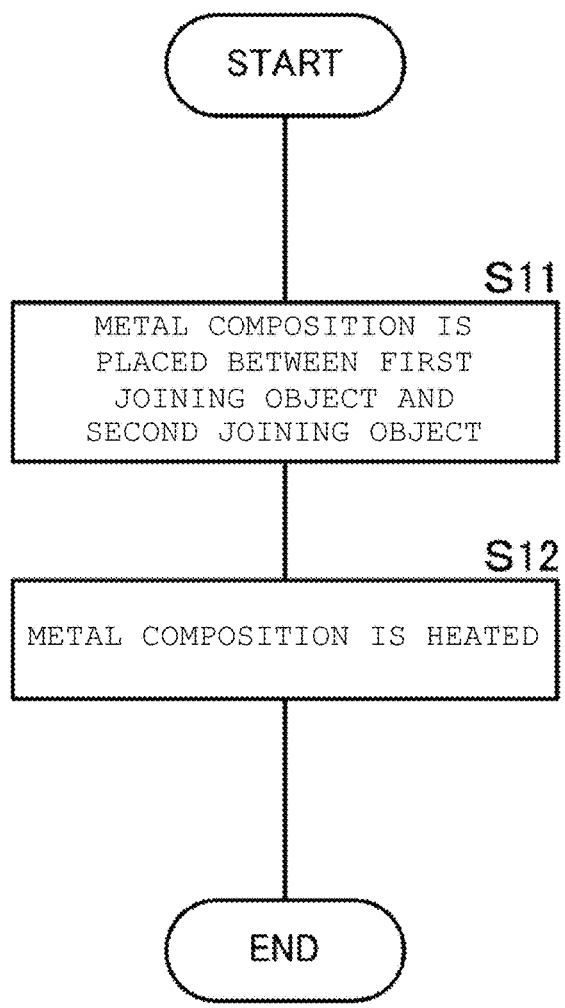
FIG. 3 is a flowchart showing a joining method using the metal composition 10 shown in FIG. 1.
Figure 4:
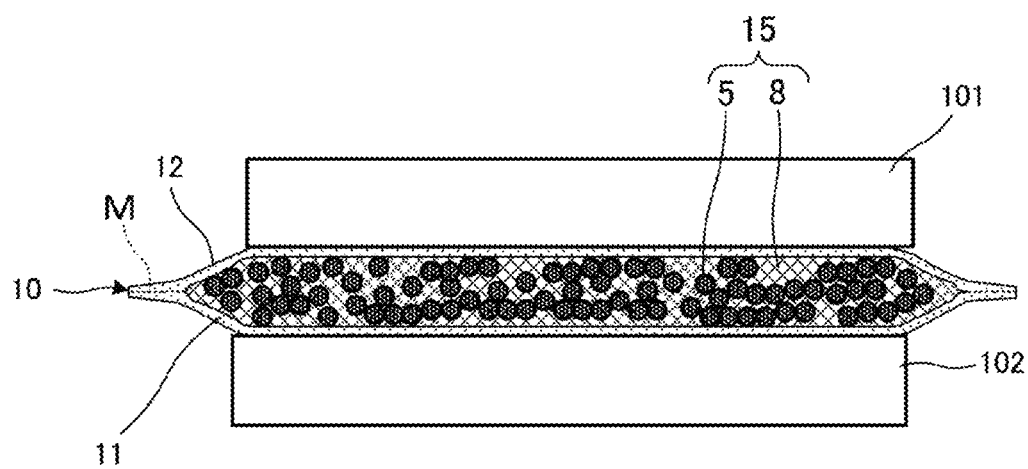
FIG. 4 is a cross-sectional view showing a state of a placing step performed in the joining method shown in FIG. 3.
Figure 5:
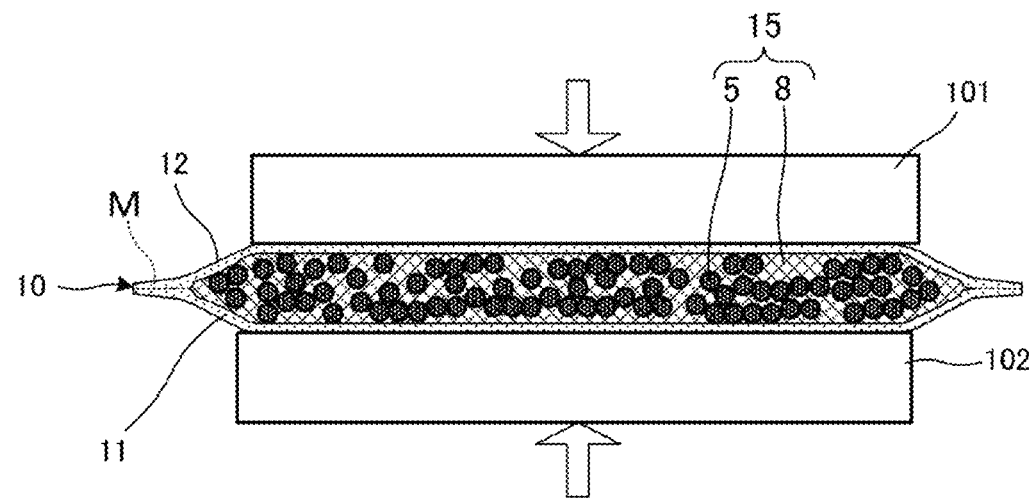
FIG. 5 is a cross-sectional view showing a state of a heating step performed in the joining method shown in FIG. 3.
Figure 6:
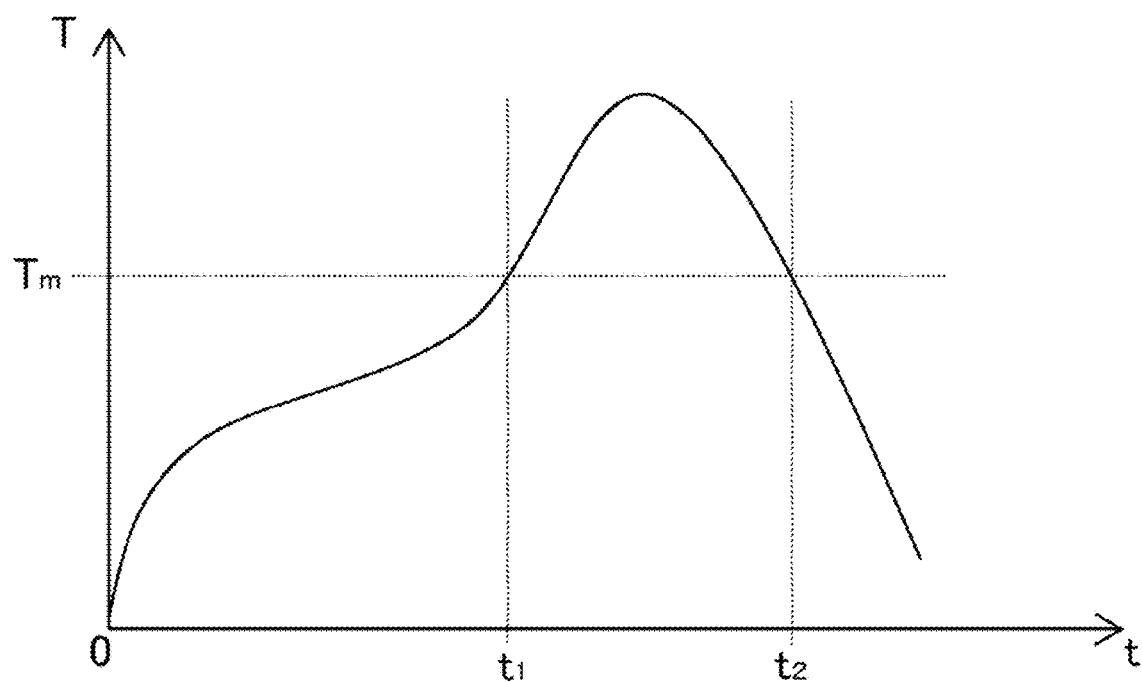
FIG. 6 is a graph showing a temperature profile of the heating step performed in the joining method shown in FIG. 3.
Figure 7:
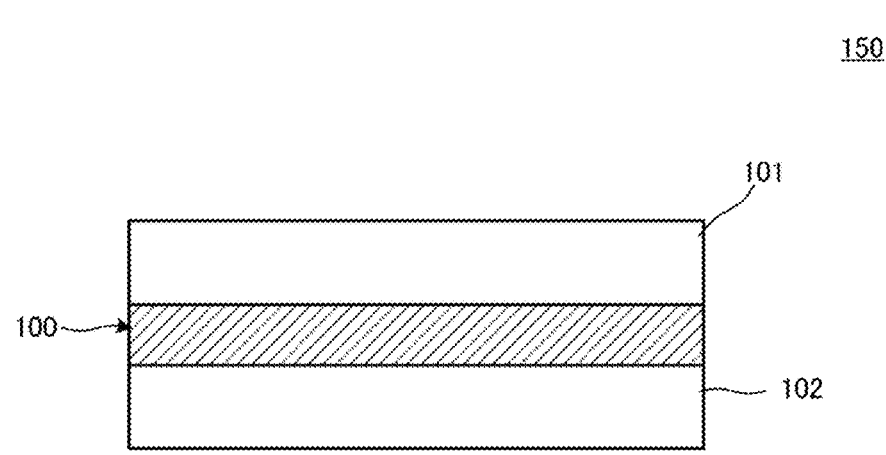
FIG. 7 is a cross-sectional view showing states of an intermetallic compound member 100 and a joined body 150 produced by the heating step performed in the joining method shown in FIG. 3.
Figure 8:
FIG. 8 is an enlarged cross-sectional view showing states of the intermetallic compound member 100 and the joined body 150 produced by the heating step performed in the joining method shown in FIG. 3.

FIG. 3 is a flow chart showing a joining method using the metal composition 10 shown in FIG. 1. FIG. 4 is a cross-sectional view showing a state of a placing step performed in the joining method shown in FIG. 3. FIG. 5 is a cross-sectional view showing a state of a heating process performed in the joining method shown in FIG. 3. FIG. 6 is a graph showing a temperature profile of the heating step performed in the joining method shown in FIG. 3. FIG. 7 is a cross-sectional view showing states of an intermetallic compound member 100 and a joined body 150 produced by the heating step performed in the joining method shown in FIG. 3. FIG. 8 is an enlarged cross-sectional view showing states of the intermetallic compound member 100 and the joined body 150 produced by the heating step performed in the joining method shown in FIG. 3.

First, the metal composition 10, the first joining object 101, and the second joining object 102 are prepared.

In the present joining method, Sn is used as the material of the metal foil 11 and the metal foil 12, and a CuNiCo alloy is used as the material of the high melting point alloy particles 5 for simplicity of description. The CuNiCo alloy is an alloy in which the first transition metal element Co is added to a CuNi alloy. The CuNiCo alloy is a material which reacts with molten Sn to produce a CuNiCoSn alloy which is an intermetallic compound.

Examples of the first joining object 101 and the second joining object 102 include an electrode member formed on a surface of an element body such as a surface electrode of an electronic component such as a multilayer ceramic capacitor, and an electrode member provided on a surface of a printed wiring board on which an electronic component is mounted. Examples of materials of the first joining object 101 and the second joining object 102 include Cu.

Next, as shown in FIG. 4, the metal composition 10 is placed between the first joining object 101 and the second joining object 102 (S11: placing step). In this state, the high melting point alloy paste 15 is sealed by the metal foil 11 and the metal foil 12. Therefore, the high melting point alloy paste 15 is not brought into contact with air outside the metal foil 11 and the metal foil 12.

Next, as shown in FIG. 5, while the metal composition 10 is compressed from the thickness direction by the first joining object 101 and the second joining object 102, the first joining object 101, the second joining object 102, and the metal composition 10 are heated (S12: heating step). In the heating step, the metal composition 10 is heated by, for example, a reflow apparatus in accordance with the temperature profile shown in FIG. 6.

Specifically, in the heating step, the metal composition 10 is heated up to a temperature within the range of equal to or higher than the melting point $T_m$ of Sn and equal to or lower than a melting point of the CuNiCo alloy. The melting point $T_m$ of Sn is 231.9° C. The melting point of the CuNiCo alloy varies depending on a content of Ni, and is, for example, 1220° C. or higher. In the heating step, for example, after preheating at 150° C. to 230° C., the metal composition 10 is heated at a heating temperature of 250° C. to 400° C. for 2 minutes to 10 minutes. The peak temperature is allowed to reach 400° C.

The solvent contained in the organic component 8 volatilizes or evaporates during the period from the start of heating until the time $t_1$ elapses.

When the temperature of the metal composition 10 reaches equal to or higher than the melting point $T_m$ of Sn by heating, the metal foil 11 and the metal foil 12 melt. Then, the molten Sn reacts with the CuNiCo alloy of the high melting point alloy particles 5 to produce the CuNiCoSn alloy which is an intermetallic compound. Then, as shown in FIGS. 7 and 8, an intermetallic compound member 100 composed of the intermetallic compound (CuNiCoSn alloy) is produced. This reaction is, for example, reaction accompanying liquid phase diffusion bonding ("TLP bonding: Transient Liquid Phase Diffusion Bonding").

Next, as shown in FIG. 6, after the time $t_2$ has elapsed, the reflow device stops heating. Accordingly, the temperature of the intermetallic compound member 100 is lower than the melting point $T_m$ of Sn, and the reaction between the molten Sn and the high melting point alloy particles 5 is completed. After time $t_2$ has elapsed, the intermetallic compound member 100 is naturally cooled to room temperature.

As described above, as shown in FIGS. 7 and 8, the metal composition 10 becomes the intermetallic compound member 100 composed of the intermetallic compound. The intermetallic compound member 100 joins the first joining object 101 and the second joining object 102 to each other. The intermetallic compound member 100 constitutes the joined body 150 together with the first joining object 101 and the second joining object 102.

As shown in FIG. 8, the intermetallic compound member 100 has a dense structure in which minute voids hardly exist.

In the high melting point alloy paste 15, an alloying reaction between Sn and the high melting point alloy particles 5 proceeds by heat treatment at a relatively low temperature. Then, the intermetallic compound (CuNiCoSn alloy) has a high melting point (for example, 400° C. or higher). Therefore, the intermetallic compound member 100 can join the first joining object 101 and the second joining object 102 to each other at a low temperature, and has high heat resistance.

In particular, since the intermetallic compound (CuNiCoSn alloy) has a melting point higher than that of the first metal, the structure of the intermetallic compound member 100 is not impaired even when an electronic component or the like having the intermetallic compound member 100 therein is further mounted on other devices, parts, substrates or the like by heating such as reflow. That is, the intermetallic compound member 100 can maintain a joining force.

Next, the intermetallic compound member 100 composed of the intermetallic compound (CuNiCoSn alloy) is compared with the conventional intermetallic compound member 800 composed of the intermetallic compound (CuNiSn alloy). The conventional intermetallic compound member 800 differs from the intermetallic compound member 100 in that the first transition metal element Co is not added.

Figure 9:
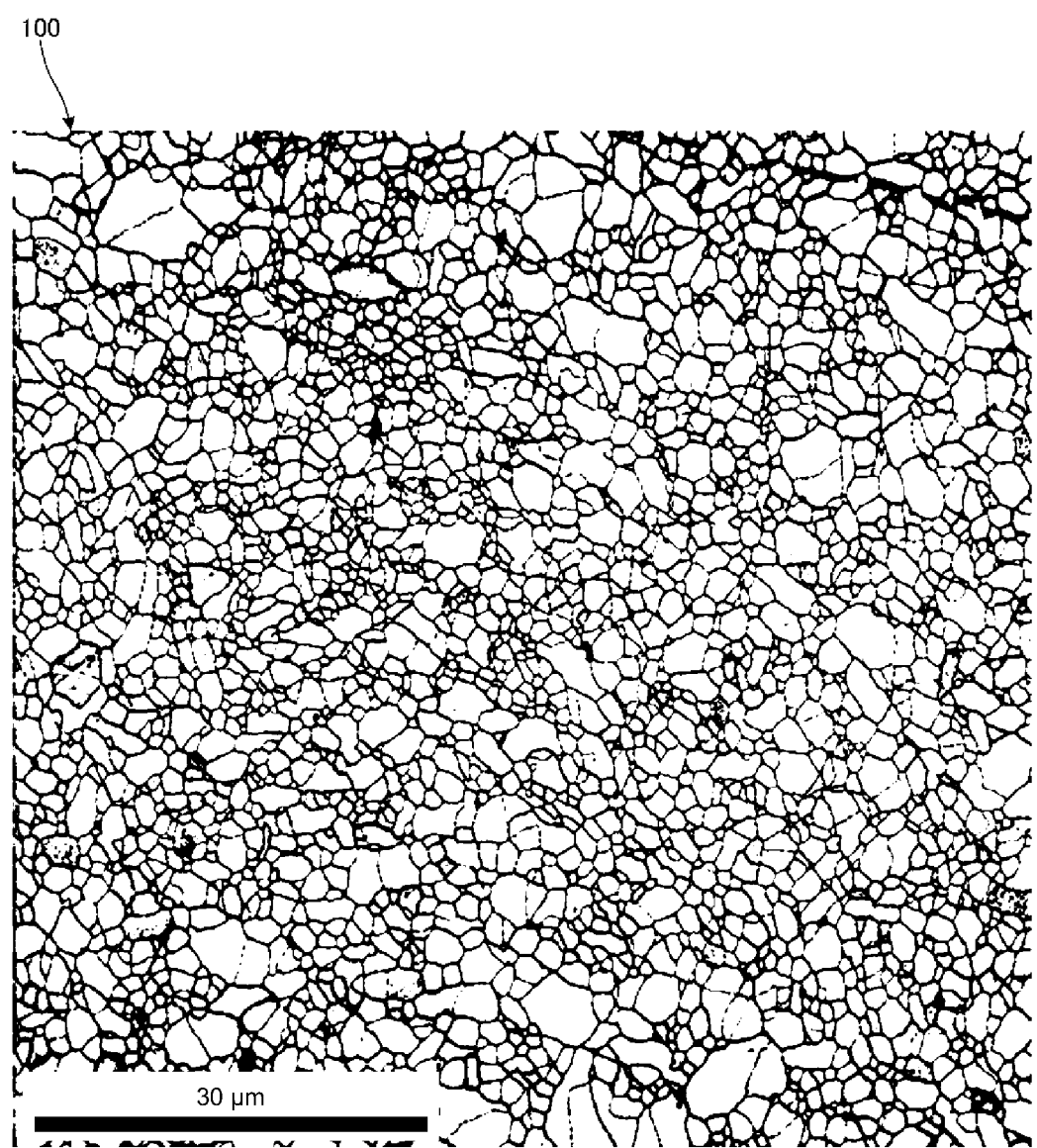
FIG. 9 is an enlarged cross-sectional view showing a polycrystalline intermetallic compound constituting the intermetallic compound member 100 shown in FIG. 8.
Figure 10:
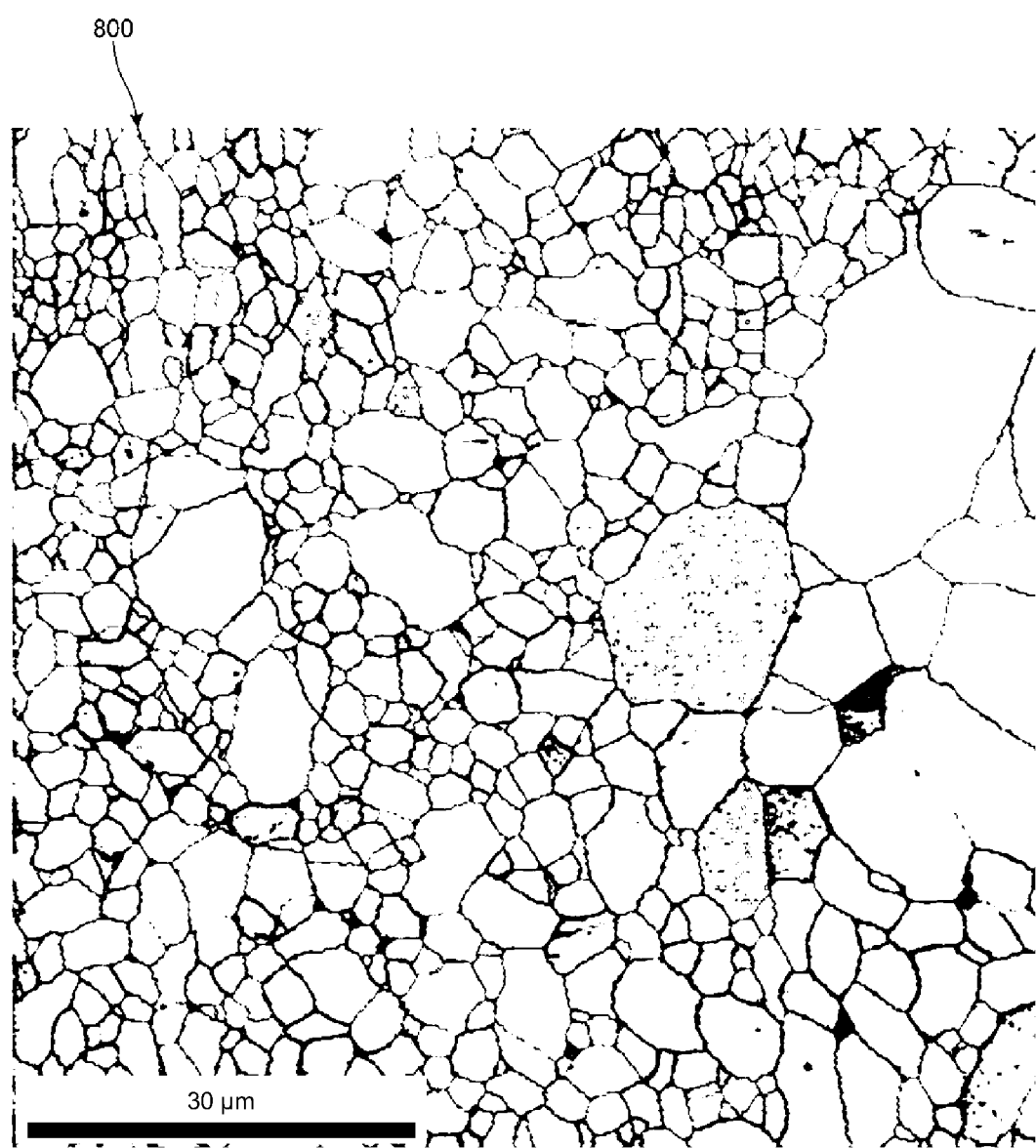
FIG. 10 is an enlarged cross-sectional view showing a polycrystalline intermetallic compound constituting an intermetallic compound member 800 according to a comparative example of the intermetallic compound member 100 shown in FIG. 9.

FIG. 9 is an enlarged cross-sectional view showing a polycrystalline intermetallic compound constituting the intermetallic compound member 100 shown in FIG. 8. FIG. 10 is an enlarged cross-sectional view showing a polycrystalline intermetallic compound constituting an intermetallic compound member 800 according to a comparative example of the intermetallic compound member 100 shown in FIG. 9.

FIG. 9 shows an image of a polycrystalline intermetallic compound produced by reaction between Sn as the first metal and a Cu-10Ni-3Co alloy as the second metal. FIG. 10 shows an image of a polycrystalline intermetallic compound produced by reaction between Sn as the first metal and a Cu-10Ni alloy as the first alloy.

FIG. 9 and FIG. 10 show images analyzed by OIM (Orientation Imaging Microscopy) manufactured by TSL Solutions. OIM is an apparatus which analyzes images measured by EBSD (Electron Back Scatter Diffraction Patterns) measuring apparatus with dedicated software.

Here, OIM analyzes that when an orientation difference of neighboring measurement points is larger than a preset angle (5° in the present embodiment), the neighboring measurement points belong to different crystal grains, and analyzes that when an orientation difference of neighboring measurement points is equal to or less than a preset angle (5° in the present embodiment), the neighboring measurement points belong to the same crystal grains.

By the measurement and analysis with OIM, it became clear that the average crystal grain size of the intermetallic compound member 100 is smaller than the average crystal grain size of the conventional intermetallic compound member 800 as shown in FIGS. 9 and 10. The reason for this is presumed that the second metal is an alloy in which the first transition metal element Co is added to the first alloy.

Next, a relationship between a crystal grain size of an intermetallic compound and a weight ratio of Ni and Co will be described with reference to FIGS. 11 and 12.

Figure 11:
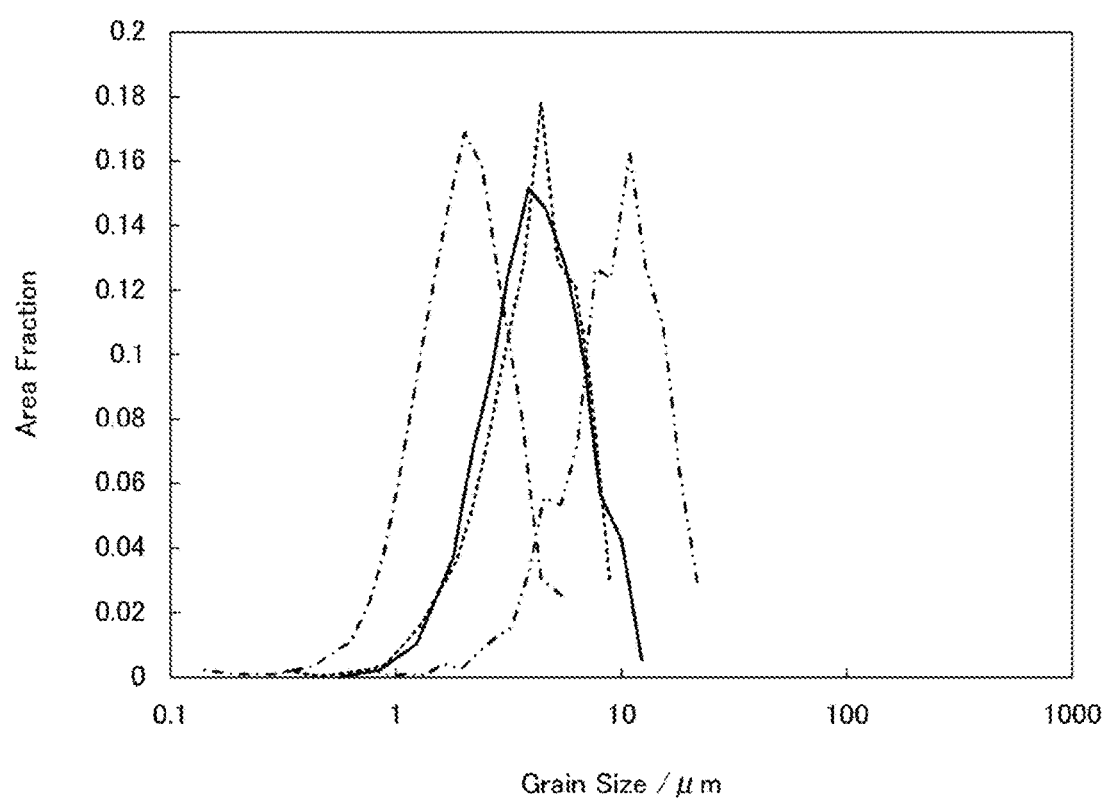
FIG. 11 is a graph showing a distribution of crystal grain size of each intermetallic compound.

FIG. 11 is a graph showing a distribution of crystal grain size of each intermetallic compound. In FIG. 11, the horizontal axis represents the crystal grain size, and the vertical axis represents a ratio (cross-sectional area ratio) of total area of a crystal grain having the crystal grain size in a cross section for analysis to a total area of the cross section for analysis. The graph shown in FIG. 11 shows results of analysis by the aforementioned OIM.

The solid line shown in FIG. 11 shows a distribution of crystal grain sizes of an intermetallic compound produced by reaction between Sn as the first metal and a Cu-3Ni alloy as the first alloy. The dotted line shown in FIG. 11 shows a distribution of grain sizes of an intermetallic compound produced by reaction between Sn as the first metal and a Cu-5Ni alloy as the first alloy. The one-dot chain line shown in FIG. 11 shows a distribution of crystal grain sizes of an intermetallic compound produced by reaction between Sn as the first metal and a Cu-10Ni-5Co alloy as the second metal. The two-dot chain line shown in FIG. 11 shows a distribution of crystal grain sizes of an intermetallic compound produced by reaction between Sn as the first metal and a Cu-10Ni alloy as the first alloy.

FIG. 12 is a table showing a relationship between an average crystal grain size of an intermetallic compound and a weight ratio of Ni and Co. The average crystal grain size shown in FIG. 12 is obtained by Area Fraction method based on the data analyzed by the aforementioned OIM. Specifically, in the cross section for analysis by OIM, an average crystal area is obtained by summing the respective values obtained by multiplying the area by the cross-sectional area ratio for each crystal grain, and a square root of a value obtained by further multiplying the average crystal area by 4 and dividing the resulting value by a circumference ratio is taken as the average crystal grain size.

According to the above analysis, it became clear that the average crystal grain size of the intermetallic compound in which the first transition metal element Co is added, as shown in FIGS. 11 and 12, is smaller than the average crystal grain size of the intermetallic compounds in which the first transition metal element Co is not added. In particular, it became clear that the average crystal grain size of the intermetallic compound in which the first transition metal element Co is added is 3 µm or less as shown in FIG. 12.

Next, a stress-strain curve of the intermetallic compound member 100 composed of the intermetallic compound (CuNiCoSn alloy) and a stress-strain curve of the conventional intermetallic compound member 800 composed of the intermetallic compound (CuNiSn alloy) will be described. First, a measurement method in a compression test that provided these stress-strain curves will be explained.

Figure 13:
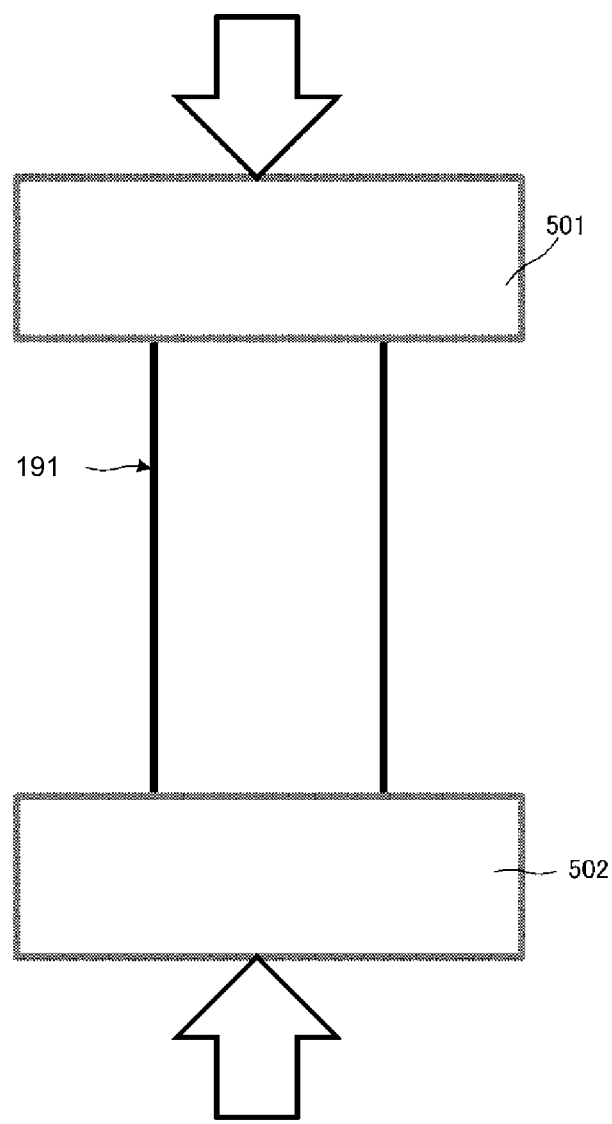
FIG. 13 is a diagram showing a measurement method in a compression test performed on the intermetallic compound member 100 shown in FIG. 9 and the intermetallic compound member 800 shown in FIG. 10.

FIG. 13 is a diagram showing a measurement method in a compression test performed on the intermetallic compound member 100 shown in FIG. 9 and the intermetallic compound member 800 shown in FIG. 10. The arrows in FIG. 13 indicate the compression direction. The compression test was carried out using a material testing machine (Instron 5982) manufactured by Instron Corporation and compression jigs 501 and 502 made by Inconel. In the compression test, used were a first test piece cut out from an intermetallic compound member 100 having an average crystal grain size of 2.2 µm by an electric discharge machine and a second test piece cut out from an intermetallic compound member 800 having an average crystal grain size of 10.5 µm by an electric discharge machine. A shape of each of the first and second test pieces is a rectangular column having a width of 2 mm, a length of 2 mm, and a thickness of 4 mm. In the compression test, each of the first and second test pieces 191, 193 was compressed by the compression jigs 501 and 502 at a strain rate of $2.1 \times 10^{-4}$ $S^{-1}$ to measure a stress, so that a stress-strain curve was obtained.

Next, results of compression tests conducted on the first and second test pieces at room temperature, 200° C. and 300° C. will be described.

Figure 14:
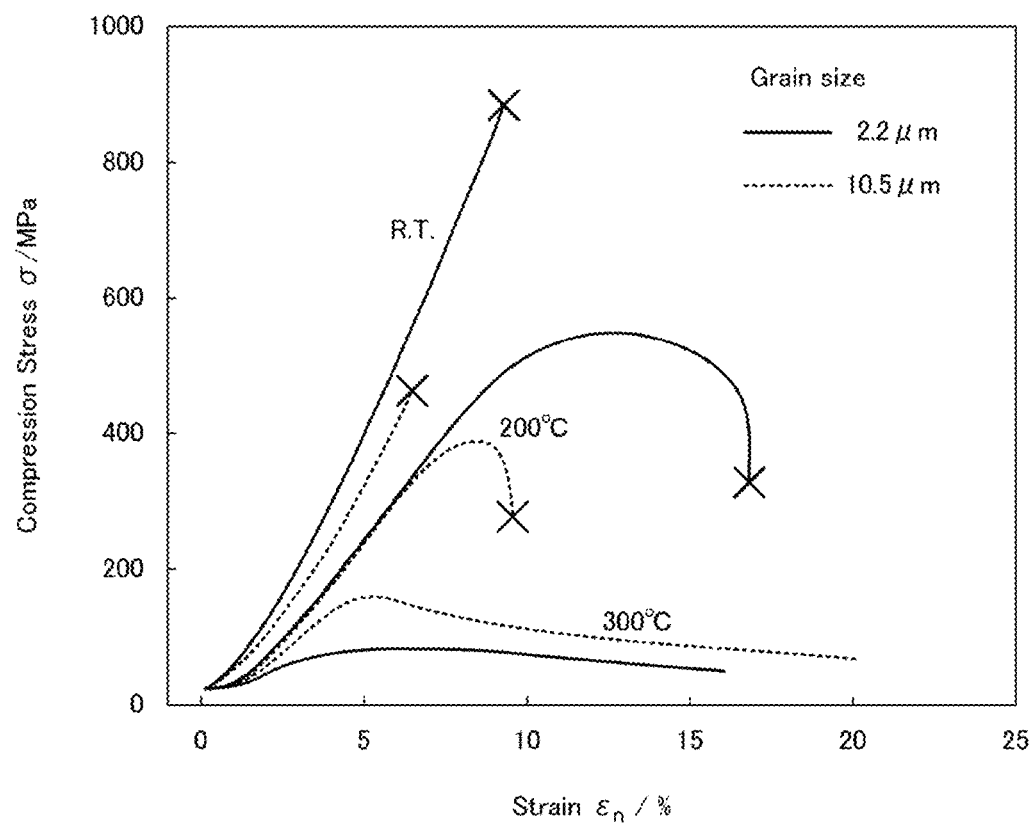
FIG. 14 is a graph showing a stress-strain curve in which results of compression tests that are conducted on a test piece 191 shown in FIG. 13 at ordinary temperature, 200° C., and 300° C. are shown.

FIG. 14 is a graph showing a stress-strain curve in which results of compression tests that are conducted on the first and second test pieces shown in FIG. 13 at ordinary temperature, 200° C., and 300° C. are shown. The solid line in FIG. 14 shows a result of the first test piece. The dotted line in FIG. 14 shows a result of the second test piece. The symbol "x" in the graph means the end of the test due to the breakage of the test piece.

As a result of performing the compression test at 300° C., it became clear as shown in FIG. 14 that in the second test piece having an average crystal grain size of 10.5 µm, the graph has a remarkable peak, and in the first test piece having an average crystal grain size of 2.2 µm, the graph does not have a peak. Here, the abrupt decrease in stress is considered to be due to the crack propagation inside the second test piece, or the like. Therefore, the peak of the graph is considered to indicate that a crack as a starting point of brittle fracture is produced by the compression test.

That is, as a result of performing the compression test at 300° C., it became clear that brittle fracture occurred in the second test piece having an average crystal grain size of 10.5 µm, and no brittle fracture occurred in the first test piece having an average crystal grain size of 2.2 µm.

Next, as a result of performing the compression test at 200° C., it became clear that the graph has remarkable peaks in both the second test piece having an average crystal grain size of 10.5 µm and the first test piece 191 having an average crystal grain size of 2.2 µm. However, as a result of performing the compression test at 200° C., the first test piece having an average crystal grain size of 2.2 µm generates a peak, that is, brittle fracture at a position where the amount of strain is larger than the second test piece having an average crystal grain size of 10.5 µm, and therefore it became clear that the first test piece is strong against strain.

Next, as a result of performing the compression test at room temperature, the first test piece having an average crystal grain size of 2.2 µm caused fracture at a position where the strain amount was larger as compared with the second test piece having an average crystal grain size of 10.5 µm, and therefore it became clear that the first test piece is resistant to compressive stress.

From the above results, it is considered that the intermetallic compound member 100 has high plastic deformability at high temperature as compared with the conventional intermetallic compound member 800 having a large crystal grain size. Therefore, even if mechanical stress due to thermal shock is large, the intermetallic compound member 100 can absorb the mechanical stress and hardly causes brittle fracture.

Accordingly, the intermetallic compound member 100 has high plastic deformability at high temperature and hardly causes brittle fracture. Furthermore, the intermetallic compound member 100 has high compressive strength at room temperature as compared with the conventional intermetallic compound member 800 having a large crystal grain size.

As shown in FIGS. 8 and 9, the intermetallic compound continuously exists from the first joining object 101 to the second joining object 102 in the intermetallic compound member 100. That is, the intermetallic compound having high plastic deformability at high temperature directly connects the first joining object 101 and the second joining object 102 directly.

Therefore, the joined body 150 can adequately exhibit the high plastic deformability of the intermetallic compound. In addition, the continuous presence of the intermetallic compound means that there are few voids in the intermetallic compound member 100, which means that the strength of the intermetallic compound member 100 itself is improved.

Accordingly, the joined body 150 has high plastic deformability at high temperature and hardly causes brittle fracture. Furthermore, the joined body 150 has high strength at room temperature.

Figure 15:
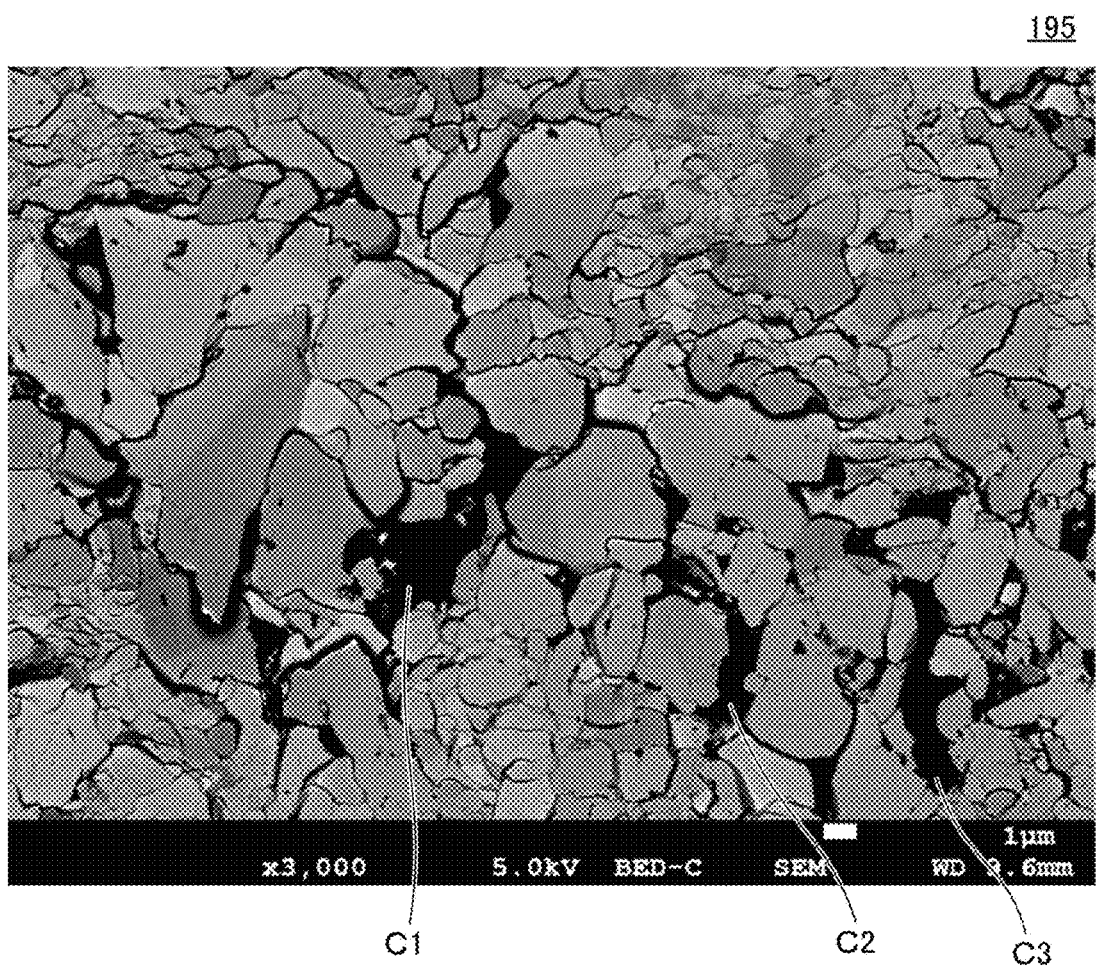
FIG. 15 is an enlarged cross-sectional view showing a state of polycrystals constituting a test piece 195 after the compression test shown in FIG. 13.
Figures 16, 17:
FIG. 16 is an enlarged cross-sectional view of a portion where cracks C1 to C3 are generated in the test piece 195 shown in FIG. 15.
FIG. 17 is a table showing a relationship between Erosion Speed and alloy composition.

FIG. 15 is an enlarged cross-sectional view showing a state of polycrystals constituting a test piece 195 after the compression test shown in FIG. 13. FIG. 16 is an enlarged cross-sectional view of a portion where cracks C1 to C3 are generated in the test piece 195 shown in FIG. 15. In this compression test, used was a test piece 195 in which an intermetallic compound having a large crystal grain size and an intermetallic compound having a small grain size were mixed.

Note that the image in FIG. 15 is an image captured by a reflection electron detector.

As a result of observing a cross section of the test piece 195 subjected to the aforementioned compression test, it became clear as shown in FIG. 15 that the cracks C1 to C3 as starting points of brittle fracture were generated in the test piece 195.

However, as shown in FIG. 16, it became clear that the average crystal grain size of the portion where the cracks C1 to C3 were generated in the test piece 195 was 3.06 μm as a result of analysis by the OIM based on Area Fraction method. That is, it became clear that in the test piece 195, cracks as starting points of brittle fracture are not generated in a portion where the average crystal grain size is 3.0 μm or less.

Therefore, it is considered that the average crystal grain size of the intermetallic compound is preferably 3.0 μm or less.

Next, the production rates of a CuNiCoSn alloy, a CuNiFeSn alloy, and CuNiSn alloy will be described. FIG. 17 is a table showing a relationship between Erosion Speed and alloy composition. The Erosion Speed was measured at the time when an alloy having each composition shown below and molten Sn were caused to react under the following conditions.

Melting temperature: 290° C.
Melting time: 10 minutes

In FIG. 17, a sample of No. 1 indicates the case where Sn was caused to react with a CuNi alloy, samples of No. 2 to No. 5 indicate the case where Sn was caused to react with a CuNiCo alloy, and a sample of No. 6 indicates the case where Sn was caused to react with a CuNiFe alloy. The rows of amount of Ni, amount of Co, and amount of Fe in FIG. 17 indicate weight percentages of Ni, Co, Fe contained in each sample. Erosion Speed is a value obtained by calculating back a thickness of a Cu alloy plate consumed per unit time for production of intermetallic compounds, with quantifying the produced intermetallic compounds with image analysis and assuming that all of the produced intermetallic compounds turn into $(Cu, M)_6Sn_5$. The larger the Erosion Speed is, the faster the production rate of the intermetallic compound is. It is found that in the case of the samples of No. 2 to No. 6 in which the first transition element is added, the Erosion Speed increases up to about 8.5 times at maximum as compared with the case of the sample of No. 1 in which the first transition metal element is not added.

When the first transition element is added to the first alloy, the crystal grain size of the intermetallic compound produced by the reaction between the first metal and the second metal becomes smaller as compared with the case where the first transition element is not added. As a result, it is considered that the grain boundary diffusion path of the first metal in the intermetallic compound increases, the diffusion rate increases, and therefore the production rate of the intermetallic compound becomes faster.

OTHER EMBODIMENTS

In the joining method of the present embodiment, the materials of the metal foil 11 and the metal foil 12 are Sn alone, but the materials are not limited to Sn alone. In practice, the materials of the metal foil 11 and the metal foil 12 may be Sn-based alloys. In addition, the material of the metal foil 11 and the material of the metal foil 12 may be different from each other. Examples of the Sn-based alloy include SnAgCu alloy, SnAg alloy, SnCu alloy, SnBi alloy, SnSb alloy, SnAu alloy, SnPb alloy, SnZn alloy, and the like.

Further, in the metal composition 10 of the present embodiment, the metal foil 11 and the metal foil 12 are fusion-bonded around the entire circumference of the high melting point alloy paste 15 with the high melting point alloy paste 15 sandwiched therebetween, but the configuration is not limited to the above. For example, the metal foil 11 and the metal foil 12 may be partially fusion-bonded or may not be fusion-bonded. Furthermore, for example, the metal foil 12 may not be provided.

In the metal composition 10 of the present embodiment, the metal foil 11 and the metal foil 12 correspond to the first metal, and the high melting point alloy paste 15 corresponds to the second metal, but the configuration is not limited to the above. For example, the first metal may not be in a foil shape but may be in a particle shape or paste shape, the second metal may not be in a paste shape but may be in a particle shape or foil shape, and the metal composition may be in a shape of appropriate combination of these.

In addition, in the joining method of the present embodiment, the material of the high melting point alloy particles 5 is CuNiCo alloy, but the material is not limited to this. In practice, the material of the high melting point alloy particles 5 may be, for example, CuMnCo alloy particles.

The metals and the alloys described in the present specification do not refer to the exact composition, and may contain elements not specified as impurities to an extent that they do not inhibit the reaction between the first metal and the second high melting point metal, for example, at a ratio of 1 wt % or less.

In the case of using CuMnCo alloy particles, an intermetallic compound is produced by reaction between molten Sn and the CuMnCo alloy particles. The intermetallic compound is, for example, $(Cu, Mn, Co)_6Sn_5$.

In the heating step in the present embodiment, the metal composition 10 is heated with hot air, but the heating method is not limited to this. In carrying out the heating step, the metal composition 10 may be subjected to, for example, far infrared heating, high frequency induction heating, a hot plate heating or the like.

In the heating step in the present embodiment, the metal composition 10 is heated by hot air in the atmosphere, but the heating method is not limited to this. In carrying out the heating step, the metal composition 10 may be heated with hot air in, for example, $N_2$, $H_2$, formic acid, or vacuum.

In the heating step in the present embodiment, the metal composition 10 is pressurized during heating, but the heating step is not limited to this. In carrying out the heating step, the metal composition 10 may not be pressurized during heating.

In the present embodiment, the metal composition 10 is used as a joining material, but an application of the metal composition 10 is not limited to this. For example, the intermetallic compound produced by the metal composition 10 may be used for a vibration damping damper as a superplastic material.

While a general intermetallic compound is brittle, the intermetallic compound produced by the metal composition 10 has high plastic deformability and can be processed. Therefore, the intermetallic compound produced by the metal composition 10 can be used for a workpiece such as a molded product. In addition, since the intermetallic compound is a material that can be processed and has a metallic feeling of silver color, it can be used for shaping and decorating purposes for art objects, toys, and the like, for example.

Finally, the description of the above embodiment is illustrative in all respects, and is not restrictive. The scope of the present invention is not within the above-mentioned embodiment but within the claims and the equivalent thereof.

DESCRIPTION OF REFERENCE SYMBOLS

C1, C2, C3: Crack
M: Fused portion
5: High melting point alloy particles
8: Organic component
10: Metal composition
11: Metal foil
12: Metal foil
15: High melting point alloy paste
100: Intermetallic compound member
101: First joining object
102: Second joining object
150: Joined body
191: Test piece
195: Test piece
501, 502: Compression jig
800: Intermetallic compound member

The invention claimed is:

1. A metal composition comprising:
reactive metals consisting of:
   a first metal; and
   a second metal having a melting point higher than a melting point of the first metal,
   wherein the second metal is an alloy capable of producing an intermetallic compound member with the first metal, and the first metal and the second metal are present in the reactive metals in an amount sufficient to form the intermetallic compound member,
   the second metal is a Cu-xNi-yCo alloy, where x is 1 to 10, and y is 0.5 to 10,
   the first metal is Sn or an Sn-based alloy capable of producing molten Sn that would react with the second metal to produce the intermetallic compound member such that the intermetallic compound member would contain an intermetallic compound that is a CuNiCoSn alloy having an average crystal grain size of 3 μm or less as measured by Orientation Imaging Microscopy based on an Area Fraction method and that would continuously exist between a first surface and a second surface of the intermetallic compound member, and that the intermetallic compound that would be produced from the reactive metals does not exhibit a brittle fracture during compression at a temperature of 300° C. and a strain rate of $2.1 \times 10^{-4}$ $S^{-1}$, and
   an average particle size (D50) of the second metal is 0.1 μm to 30 μm.

2. The metal composition according to claim 1, further comprising a flux.

3. The intermetallic compound member formed by the metal composition of claim 1, the intermetallic compound continually existing between the first surface and the second surface of the intermetallic compound member, and the intermetallic compound is the CuNiCoSn alloy having the average crystal grain size of 3 μm or less as measured by the Orientation Imaging Microscopy based on the Area Fraction method, and the intermetallic compound does not exhibit the brittle fracture during compression at the temperature of 300° C. and the strain rate of $2.1 \times 10^{-4}$ $S^{-1}$.

4. A joined body comprising:
a first joining object;
a second joining object; and
the intermetallic compound member according to claim 3 joining the first joining object and the second joining object to each other.

5. The metal composition according to claim 1, where x is 2 to 5, and y is 2 to 4.

* * * * *